(12) United States Patent
Ishikawa et al.

(10) Patent No.: US 8,081,454 B2
(45) Date of Patent: Dec. 20, 2011

(54) GAS EJECTOR, ELECTRONIC DEVICE, AND GAS-EJECTING METHOD

(75) Inventors: Hiroichi Ishikawa, Kanagawa (JP); Tomoharu Mukasa, Saitama (JP)

(73) Assignee: Sony Corporation, Tokyo (JP)

( * ) Notice: Subject to any disclaimer, the term of this patent is extended or adjusted under 35 U.S.C. 154(b) by 1185 days.

(21) Appl. No.: 10/595,975

(22) PCT Filed: Feb. 2, 2005

(86) PCT No.: PCT/JP2005/001867
§ 371 (c)(1),
(2), (4) Date: May 23, 2006

(87) PCT Pub. No.: WO2005/090789
PCT Pub. Date: Sep. 29, 2005

(65) Prior Publication Data
US 2009/0219686 A1 Sep. 3, 2009

(30) Foreign Application Priority Data
Mar. 18, 2004 (JP) ................. P2004-078030

(51) Int. Cl.
*H05K 7/20* (2006.01)
(52) U.S. Cl. ....... 361/694; 361/692; 165/80.3; 165/122; 417/410.2; 417/413.2
(58) Field of Classification Search .................. 361/692, 361/694, 695, 699, 700
See application file for complete search history.

(56) References Cited

U.S. PATENT DOCUMENTS

| 4,753,579 | A | * | 6/1988 | Murphy ................... 417/410.2 |
| 4,923,000 | A | * | 5/1990 | Nelson ........................ 165/122 |
| 5,008,582 | A | * | 4/1991 | Tanuma et al. ............... 310/332 |
| 5,798,465 | A | * | 8/1998 | Ziada et al. ................ 73/861.21 |
| 5,861,703 | A | * | 1/1999 | Losinski ...................... 310/330 |
| 5,894,990 | A | * | 4/1999 | Glezer et al. ................. 239/423 |
| 6,123,145 | A | | 9/2000 | Glezer et al. |
| 6,308,740 | B1 | * | 10/2001 | Smith et al. .................. 137/892 |
| 6,588,497 | B1 | * | 7/2003 | Glezer et al. ................... 165/84 |
| 7,282,837 | B2 | * | 10/2007 | Scher et al. .................. 310/328 |
| 2005/0121171 | A1 | * | 6/2005 | Mukasa et al. ............... 165/80.3 |

FOREIGN PATENT DOCUMENTS

| EP | 1 529 963 | 5/2005 |
| JP | 55-101800 | 8/1980 |
| JP | 02-213200 | 8/1990 |
| JP | 03-116961 | 5/1991 |

(Continued)

OTHER PUBLICATIONS

International Search Report dated Jun. 21, 2005.
Australian Patent Office Examination Report issued on Apr. 2, 2007.

*Primary Examiner* — Courtney Smith
(74) *Attorney, Agent, or Firm* — SNR Denton US LLP

(57) ABSTRACT

A gas ejector capable of effectively dissipating heat generated from a heater while inhibiting noise generation as little as possible, an electronic device equipped with the gas ejector, and a gas-ejecting method are offered. A gas ejector (1) according to the present invention includes a vibrator (25) and ejects gas in a form of a pulsating flow such that vibration of the vibrator allows sound waves respectively generated upon ejection of the gas ejected from nozzles (23) and (24) to deaden out each other. Also, a control section (20) optimizes the frequency of the vibrator (25), hence, by increasing the gas ejection quantity as much as possible while inhibiting noise generation, heat of a heater is effectively dissipated.

25 Claims, 11 Drawing Sheets

FOREIGN PATENT DOCUMENTS

| | | |
|---|---|---|
| JP | 6-22582 | 3/1994 |
| JP | 10-047254 | 2/1998 |
| JP | 2000-223871 | 11/2000 |
| JP | 2001-355574 | 12/2001 |
| WO | 03/036098 | 5/2003 |
| WO | 2005/008348 | 1/2005 |

\* cited by examiner

| FREQUENCY A | AMPLITUDE B | AREA C | EVALUATION VALUE D | FLOW RATE | CHAMBER DIMENSIONS | VOLUME |
|---|---|---|---|---|---|---|
| Hz | mm | mm$^2$ | mm$^3$/s | m/s | mm × mm × mm | cm$^3$ |
| 200 | 0.38 | 2036 | 154,736 | 3.1 | 95 × 40 × 10 | 38 |
| 220 | 0.42 | 2036 | 188,126 | 3.95 | 95 × 40 × 10 | 38 |
| 170 | 0.38 | 4072 | 263,051 | 4.51 | 170 × 42 × 7 | 50 |
| 30 | 1.5 | 6362 | 286,290 | 3.83 | 125 × 125 × 24 | 375 |
| 30 | 0.68 | 6362 | 129,785 | 2 | 125 × 125 × 24 | 375 |
| 30 | 1.5 | 2827 | 127,215 | 3.47 | 75 × 80 × 10 | 60 |
| 70 | 1.5 | 2827 | 296,835 | 5.3 | 75 × 80 × 10 | 60 |
| 50 | 2 | 3848 | 384,800 | 4.6 | 125 × 125 × 24 | 375 |
| 30 | 2 | 3848 | 230,880 | 4.1 | 125 × 125 × 24 | 375 |

Fig.13

GAS EJECTOR, ELECTRONIC DEVICE, AND GAS-EJECTING METHOD

TECHNICAL FIELD

The present invention relates to a gas ejector configured to eject gas so as to dissipate heat generated by a heater, an electronic device equipped with the gas ejector, and a gas-ejecting method.

BACKGROUND ART

Hitherto, increase in the quantity of heat generated from a heater such as an IC (integrated circuit) due to a higher performance of a PC (personal computer) causes a problem, and a variety of heat dissipation methods are proposed or commercialized. With one of the methods for dissipating the heat, by arranging a heat dissipation fin composed of metal such as aluminum to contact with the IC, heat is conducted from the IC to the fin so as to be dissipated. Also, with another one of the methods, by employing a fan, hot air in a housing of, e.g., a PC is forcefully repelled, low-temperature circumambient air is introduced to the surrounding of the heater so as to achieve heat dissipation. With another one of the methods, by employing a dissipation fin and a fan together, hot air around the dissipation fin is forcefully rejected with the fan while making the contact area between a heater and air wider.

Unfortunately, forceful circulation by such a fan generates a temperature boundary layer on the surface of a downstream part of the dissipation fin causes a problem that heat cannot be effectively released from the dissipation fin. In order to solve such a problem, although increasing the wind speed of the fan so as to make the temperature boundary layer thinner can be a candidate, increasing the number of revolution of the fan in order to increase the wind speed causes a problem that a noise is generated by the bearing section of the fan or a wind noise is generated due to a wind from the fan.

In some methods for breaking the temperature boundary layer so as to effectively release heat, a synthetic jet flow is utilized. This is intended to eject moving air generated, e.g., by a reciprocating piston provided in a chamber, though a hole perforated at one end of the chamber. The air ejected through the hole is called a synthetic jet flow and facilitates mixture of air so as to break the temperature boundary layer, thereby more effectively dissipating heat than by known forceful circulation with a fan (see, e.g., Description of U.S. Pat. No. 6,123,145 (FIG. 8, and so forth) and Japanese Unexamined Patent Application Publication 2000-223871 (FIG. 2)).

Unfortunately, with the technique set forth in Description of the foregoing U.S. Pat. No. 6,123,145, vibration of air due to a reciprocal motion of the piston propagates as a sound wave, thereby causing the sound wave to occur a noise problem. Also, since the trend of an IC for a higher clock in recent years causes the quantity of generated heat to grow steadily, in order to break the temperature layer formed in the vicinity of the dissipation fin, due to the heat generation, sending a more quantity of air towards the IC and the dissipation fin than ever is needed. If done so, even in an apparatus of ejecting air by vibrating a timbale as that shown in FIG. 1A disclosed in Description of the foregoing U.S. Pat. No. 6,123,145, the ejection quantity of air must be increased by making the amplitude of the vibration greater. Accordingly, if the frequency of the timbale is in an audible band, a problem of a noise of the timbale also occurs. On the contrary, while a decrease in the frequency reduces a noise, the ejection quantity of air decreases accordingly.

In view of the above-described circumstances, an object of the present invention is to offer a gas ejector capable of effectively dissipating heat generated from a heater while inhibiting noise generation as little as possible, an electronic device equipped with the gas ejector, and a gas-ejecting method.

DISCLOSURE OF INVENTION

In order to achieve the foregoing object, a gas ejector according to the present invention includes at least one vibrator, a plurality of ejecting sections adapted for ejecting air in a form of a pulsating flow such that vibration of the vibrator allows sound waves respectively generated upon ejection of the gas to weaken each other; and first control means for controlling the frequency of the vibration of the vibrator.

In the present invention, the term "to weaken each other" means "to arrange sound waves generated by the vibrator to weaken each other in a part of or all region in which the sound waves propagates".

According to the present invention, the plurality of ejecting sections ejects gas such that sound waves generated upon ejection of the gas weaken each other, thereby reducing a noise. Especially, since the first control means optimizes the frequency of the vibrator, the gas ejection quantity is increased as much as possible while inhibiting noise generation, thereby effectively dissipating heat of a heater. In order to arrange sound waves to weaken each other, their phases are shifted, for example. Alternatively, in order to arrange sound wave to weaken each other, chambers are formed by partitioning with at least one vibrator, and the vibrator is vibrated so as to eject gas alternately from these chambers.

Also, the plurality of ejecting sections includes a single housing including, for example, a plurality of openings adapted for ejecting gas, or alternatively, a plurality of chambers (or housings), each including at least one opening, and so forth. In the latter case, for example, the gas ejector has a structure in which a single housing has at least one vibrator disposed therein and a plurality of chambers formed therein with the vibrator serving as a partition.

According to one mode of the present invention, the gas ejector further includes second control means for controlling the amplitude of the vibrator. For example, by optimizing the amplitude of the vibrator, a desired gas ejection quantity can be obtained.

According to one mode of the present invention, the vibrator has the lowest resonant frequency not higher than 200 (Hz). In general, gradients or curves in frequency ranges lower than the lowest resonant frequencies, representing sound pressures of sounds generated from vibrators are substantially the same as each other without depending on the vibrators. Accordingly, the lower the lowest resonant frequency is, the sound pressure of the vibrator vibrated at a frequency lower than the resonant frequency is maximized. That is, since the amplitude can be increased, the gas ejection quantity can be increased as much as possible. Also, since the lower the frequency, human audibility tends to become duller, if the vibrator has a driving frequency range not higher than 200 (Hz), the quietness property taking account the human audibility can be maintained. Preferably, the vibrator have the lowest resonant frequency not higher than 150 (Hz) and be vibrated at a frequency not higher than 150 (Hz).

According to one mode of the present invention, the first control means controls the frequency so as to be not higher than 100 (Hz). With this, a noise taking account the human audibility can be further reduced. Especially, the frequency is preferably not higher than 35 (Hz).

According to one mode of the present invention, the vibrator has a surface extending substantially orthogonal to the direction of vibration thereof, and, when the area of the surface is not greater than 70,000 (mm$^2$), the first control means controls the frequency so as not to be higher than 100 (Hz), and the second control means controls the amplitude so as to be in the range from 1 (mm) to 3 (mm). The reason for arranging the area of the vibrator so as to be not greater than 70,000 (mm$^2$), is such that, even when attempted for being built in, e.g., a desktop or laptop PC, the gas ejector is too larger in size and possibly fails in being built in, whereby this arrangement is inappropriate for practical use.

In this case, if the frequency is not higher than 100 (Hz) and the amplitude is smaller than 1 mm, in order to obtain a desired gas ejection quantity, the area of the surface of the vibrator must be made greater to a large extent, and hence, this arrangement is inappropriate for practical use.

Whereas, for example, if the area of the vibrator is about 70,000 (mm$^2$) and the vibrator is vibrated at a frequency in the vicinity of 100 (Hz), the amplitude exceeding 3 (mm) causes the vibrator to have a greater inertia, resulting in a greater mechanical load. If the frequency is not higher than 100 (Hz), in order to obtain a desired gas ejection quantity, the amplitude is preferably in the range from 1.5 (mm) to 3 (mm).

Also, especially, since the vibrator has a surface extending substantially orthogonal to the direction of vibration thereof, and, when the area of the surface is not greater than 70,000 (mm$^2$), the first control means controls the frequency so as not to be higher than 35 (Hz), and the second control means controls the amplitude so as to be in the range from 1 (mm) to 5 (mm), a noise can be further reduced. When the frequency is not higher than 35 (Hz) and the amplitude is smaller than 1 mm, in order to obtain a desired gas ejection quantity, the area of a vibrator, which will be described later, must be made greater to a large extent, whereby this arrangement is inappropriate for practical use.

Whereas, for example, if the area of the vibrator is about 70,000 (mm$^2$) and, when the vibrator is vibrated at a frequency in the vicinity of 35 (Hz), the amplitude exceeding 5 (mm) causes the vibrator to have a considerable large inertia due to its large vibrating surface, resulting in a large mechanical load. When the frequency is not higher than 35 (Hz), the amplitude is preferably in the range from 2 (mm) to 5 (mm), and ideally from 3 (mm) to 5 (mm).

According to one mode of the present invention, the vibrator has a surface extending substantially orthogonal to the direction of vibration thereof and the area of the surface is in the range from 1,500 (mm$^2$) to 70,000 (mm$^2$). For example, if the area is smaller than 1,500 (mm$^2$), in order to obtain a desired gas ejection quantity, the frequency must exceed the foregoing value of 200 (Hz), resulting in an increased noise, or alternatively, the amplitude must be arranged so as not to be smaller than, e.g., 5 (mm), and hence, this arrangement is inappropriate for practical use. In this case, the area of the vibration surface is preferably not smaller than 2,000 (mm$^2$).

According to one mode of the present invention, the vibrator has a surface extending substantially orthogonal to the direction of vibration thereof, and when the frequency driven by the first control means, the amplitude driven by the second control means, and the area of the surface are respectively defined by A (Hz), B (mm), and C (mm$^2$), the value of A×B×C is given in the range from 100,000 (mm$^3$/s) to 10,1000,000 (mm$^3$/s). If the value lies within the range, a desired gas ejection quantity is obtained and a heat dissipation process is effectively achieved. Especially, it is preferable that the value of A×B×C be not smaller than 200,000 (mm$^3$/s). Here, the vibrator has a fluctuation amplitude twice the amplitude B, and when the vibrator includes a diaphragm, and the front and rear surfaces of the diaphragm are used, "C" is twice the area of the front or rear surface of the vibrator.

According to one mode of the present invention, a thermal resistance of the region between a heater, to which the gas ejected from the respective ejecting sections is supplied, and gas surrounding the heater is not greater than 0.7 (K/W) and a noise level at a position about 1 (m) away from the sound source of the sound waves is not higher than 30 (dBA). Thermal resistance serves also as a cooling capacity of the gas ejector. The noise level is preferably arranged so as not to be higher than 25 (dBA). For example, electronic components such as an IC chip and a resistor, and a heat dissipation fin (a heat sink) are listed as the heaters, however, any material other than the above listed ones serves as a heater as long as it generates heat, and this also applies to the following descriptions.

In that case, an envelope volume containing the respective ejecting sections and the heater is not greater than 250 (cm$^3$).

Alternatively, a thermal resistance of the region between a heater, to which the gas is ejected from the respective ejecting sections, and gas surrounding the heater is not greater than 0.5 (K/W), a noise level at a position about 1 (m) away from the sound source of the sound waves is not higher than 30 (dBA), and an envelope volume containing the respective ejecting sections and the heater is not greater than 500 (cm$^3$).

According to one mode of the present invention, the vibrator has an approximately symmetrical shape with respect to a plane extending orthogonal to the direction of vibration thereof. Since such a symmetric structure allows not only the respective sound waves to have mutually the same amplitudes and so forth but also the harmonic waves serving as the distorted components of the sound waves to have mutually the same amplitudes and so forth to the utmost, a noise is further reduced.

According to one mode of the present invention, the vibrator includes a first vibrator having a surface extending orthogonal to the direction of vibration thereof and an asymmetrical shape with respect to the surface; and a second vibrator having substantially the same shape as that of the first vibrator and arranged so as to vibrate along substantially the same direction as but in an opposite direction to that of the first vibrator. With such a structure, even when the vibrators have an asymmetric shape, by arranging them in a mutually opposite direct, the overall symmetry can be kept. Accordingly, the waveforms of sound waves respectively generated from the plurality of nozzles can be made the same as each other to the utmost, thereby improving a quietness property. A member having a loudspeaker shape including, e.g., a coil section and a magnet section may be employed as the vibrator having an asymmetric shape.

According to one mode of the present invention, the respective ejecting sections includes a housing including a plurality of chambers partitioned by the vibrator such that the chambers adapted for ejecting the gas have substantially the same volume as each other. For example, when the housing has a plurality of openings, each allowing each chamber to communicate with the outside of the housing, gas can be ejected trough the openings. According to the present invention, by arranging the respective chambers so as to have mutually the same volume, the ejection quantities of gas, the amplitudes of sounds, and the like generated from the respected chambers can be made the same as each other, thereby effectively achieving a heat dissipation process and reducing a noise as low as possible. In the gas ejector according to the present invention, the ejecting sections do not have respective housings but all ejector sections collectively have a single housing. The vibrator may be singular or plural, and the same applies to the following descriptions.

According to one mode of the present invention, the respective ejecting sections includes a housing including a plurality of chambers partitioned by the vibrator and adapted for ejecting the gas; and an actuator arranged outside the housing and adapted for driving the vibrator. By arranging the actuator outside the housing, the volumes of the respective chambers can be made the same as each other to the utmost. If the actuator is disposed in the housing, heat of the actuator possibly remains, and remaining of the heat reduces a heat dissipation capacity. Fortunately, the present invention can be prevent such a problem. With this, as described above, the heat dissipation process is effectively achieved and, at the same time, a noise can be reduced as low as possible.

According to one mode of the present invention, the housing has a bore section extending from the outside thereof to at least one of the chambers, and the gas ejector further includes a rod extending through the bore section and fixed to the vibrator so as to move integrally with the actuator, and a supporting member provided in the bore section so as to support the rod. By providing the supporting member, the rod is prevented from deflection, thereby achieving stable vibration of the vibrator. Also, by providing the supporting member, for example, so as to cover the bore section and seal the housing, air in the housing 72 is prevented from leaking out from the bore section when the vibrator is vibrated.

An electronic device according to the present invention includes at least one heater; at least one vibrator; a plurality of ejecting sections adapted for ejecting gas in a form of a pulsating flow such that vibration of the vibrator allows sound waves respectively generated upon ejection of the gas to weaken each other; and control means for controlling the frequency of the vibration of the vibrator.

According to the present invention, by optimizing the frequency of the vibrator, the ejection quantity of gas is increased as much as possible while inhibiting a noise, thereby effectively dissipating heat of the heater. The electronic devices include a computer, a PDA (personal digital assistance), a camera, a display apparatus, an audio device, and other electric appliances.

A gas ejecting method according to the present invention includes the steps of ejecting gas in a form of a pulsating flow such that vibration of at least one vibrator allows sound waves respectively generated upon ejection of the gas to weaken each other; and controlling the frequency of the vibration of the vibrator.

According to the present invention, by optimizing the frequency of the vibrator, the ejection quantity of gas is increased as much as possible while inhibiting a noise, thereby effectively dissipating heat of the heater.

As described above, according to the present invention, heat generated from a heater is effectively dissipated while inhibiting a noise as low as possible.

BRIEF DESCRIPTION OF THE DRAWINGS

FIG. 3 is a perspective view of an example case of dissipating heat of an IC chip or the like.

FIG. 13 is a table illustrating the relationship between an evaluation value and so forth and a flow rate of gas.

BEST MODE FOR CARRYING OUT THE INVENTION

Embodiments of the present invention will be described with reference to the drawings.

Figure 1:
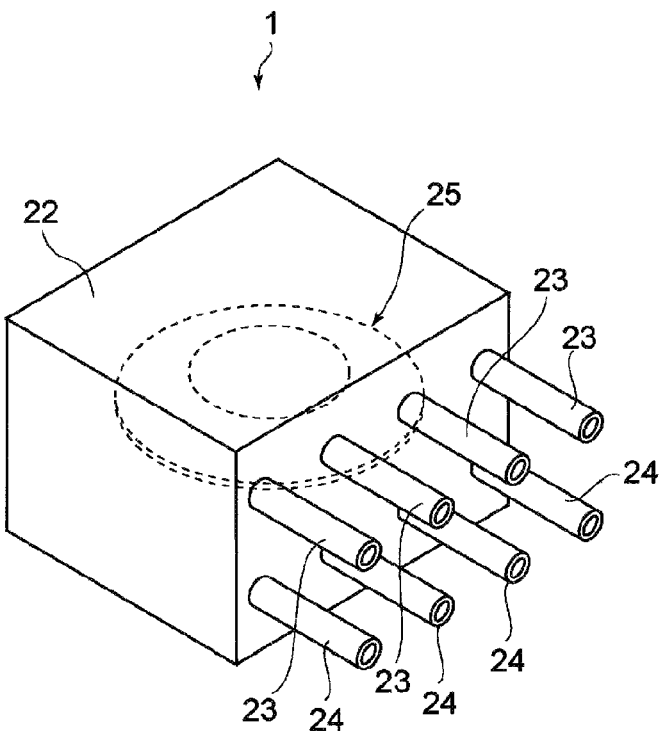
FIG. 1 is a perspective view of a gas ejector according to one embodiment of the present invention.
Figure 2:
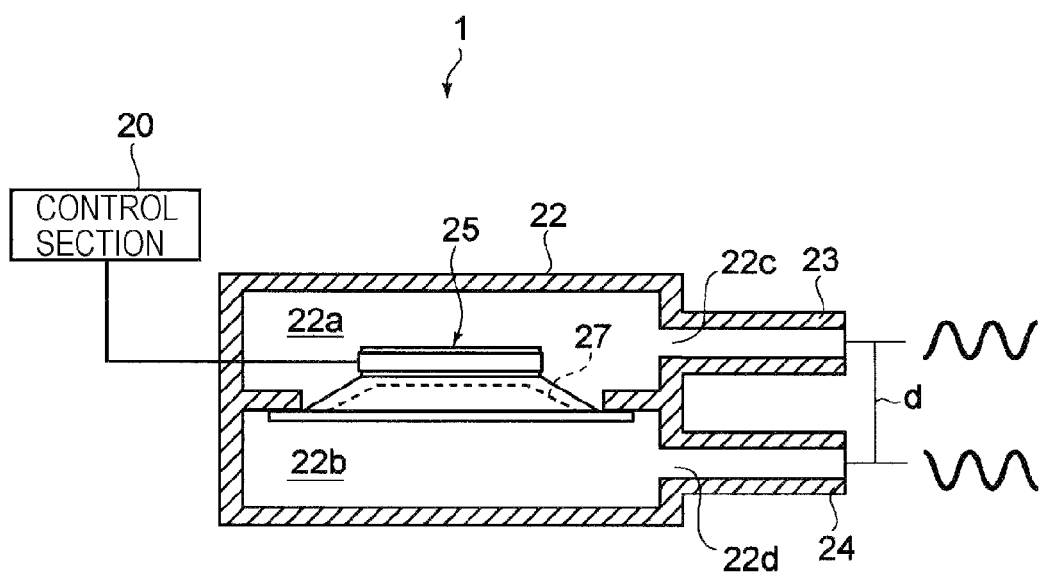
FIG. 2 is a sectional view of the gas ejector shown in FIG. 1.

FIG. 1 is a perspective view of a gas ejector according to one embodiment of the present invention. FIG. 2 is a sectional view of the gas ejector.

A gas ejector 1 includes a single housing 22. The housing 22 has a vibrator 25 arranged therein, and the inside of the housing 22 is partitioned into two chambers 22a and 22b by the vibrator 25. The chambers 22a and 22b contain air, for example. The housing 22 has pluralities of opening sections 22c and 22d formed therein so as to allow the chambers 22a and 22b partitioned as described above to respectively communicate with the outside of the housing 22. In this case, the numbers of the opening sections 22c and 22d are the same as each other. The number of the opening sections 22c (22d) may be a single. The opening sections 22c and 22d respectively have nozzles 23 and 24 disposed therein, capable of ejecting air contained in the chambers 22a and 22b. The nozzles 23 and so forth are not always necessary, and forming only the opening sections 22c and so forth may be sufficient.

The vibrator 25 includes a diaphragm 27, and the diaphragm 27 is composed of, e.g., a flexible film-like substance such as a PET (polyethylene terephthalate) film. The vibrator 25 has a structure of, e.g., a loudspeaker and is composed of a coil, a magnet, and so forth (not shown). The vibrator 25 is controlled by a control section 20. The control section 20 includes, for example, a power supply circuit for applying a sinusoidal alternative voltage on the coil of the vibrator 25, a control circuit for controlling a waveform of vibration of the vibrator 25, and so forth. The control circuit is adapted for controlling, especially, a voltage, i.e., an amplitude of the voltage to be applied on the vibrator 25, a driving frequency, or the like.

The housing 22 is composed of a highly rigid substance, e.g., a metal such as aluminum or a plastic, and has a rectangular parallelepiped shape. The housing 22 used here includes, for example, openings composed of the same material and having the same shape.

An operation of the gas ejector 1 having the structure as described above will be described. When the control section 20 drives the vibrator 25 at a predetermined frequency so as to sinusoidally vibrate the diaphragm 27, the pressure of each of the chambers 22a and 22b increases and decreases alternately. Base on this, flows of air are generated through the opening sections 22c and 22d. The flows of air are generated such that, through the nozzles 23 and 24, the air flows alternatively from the inside to the outside and from the outside to the inside of the housing 22. The air ejected from the nozzles 23 and so forth forms a synthetic jet flow. The term "a synthetic jet flow" means "a jet flow generated such that, since ejection of air through the nozzles 23 and so forth reduces a pressure around the ejected air, gas around the ejected air is drawn in the ejecting air. In other words, the ejected air and air around the ejected air are synthesized into a jet flow. Since air is ejected in a form of a pulsating flow to the outsides of the chambers 22a and 22b as described above, by blowing the ejected air onto heaters such as an IC chip and a heat sink, heat thereof is effectively dissipated.

At the same time, vibration of the diaphragm 27 alternately generates sound waves through the nozzles 23 and 24, and the sound waves propagate in the air. Since the shapes and so forth of the chambers 22a and 22b, the shapes of the opening sections 22c and 22d, and the shapes and so forth of the nozzles 23 and 24 are respectively made the same as each other, the sound waves generated from the nozzles 23 and 24 have the same waveform as each other and mutually reversed phases. Accordingly, the sound waves respectively generated through the nozzles 23 and 24 are deadened out each other, resulting in inhibiting a noise.

A spacing d between the nozzles 23 and 24 is preferably set so as to satisfy the expression: $d<\lambda/2$ (where, $\lambda$ is a wavelength of a generated sound wave). When this expression is satisfied, the sound waves generated through the nozzles 23 and so forth have no parts whose maximum amplitudes strengthen each other, thereby inhibiting generation of a noise as little as possible.

Figure 3:
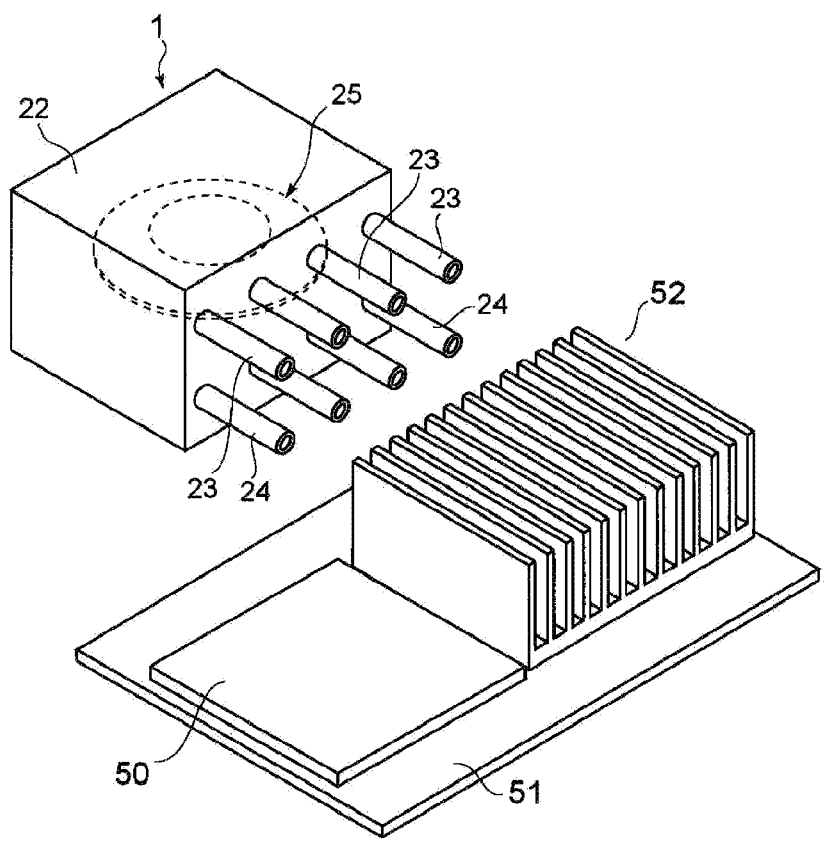

FIG. 3 is a perspective view of an example case of dissipating heat of an IC chip or the like with the aid of the gas ejector 1. An IC chip 50 is provided in contact with, e.g., a heat spreader (or a heat transporter serving as a heat pipe) 51, and the heat spreader 51 has a plurality of heat sinks 52 fixed thereto. The gas ejector 1 is arranged such that gas, e.g., from the nozzles 23 and 24 is ejected towards the heat sinks 52.

Heat generated from the IC chip 50 is spread by the heat spreader 51 and transferred to the heat sinks 52. With this, hot air stays in the vicinity of each of the heat sinks 52, resulting in forming a temperature boundary layer. Hence, jet flows generated from the nozzles 23 and 24 with vibration of, e.g., the vibrator 25 is blown towards the heat sinks 52 so as to break the temperature boundary layers, thereby effectively dissipating heat of the IC.

Figure 4:
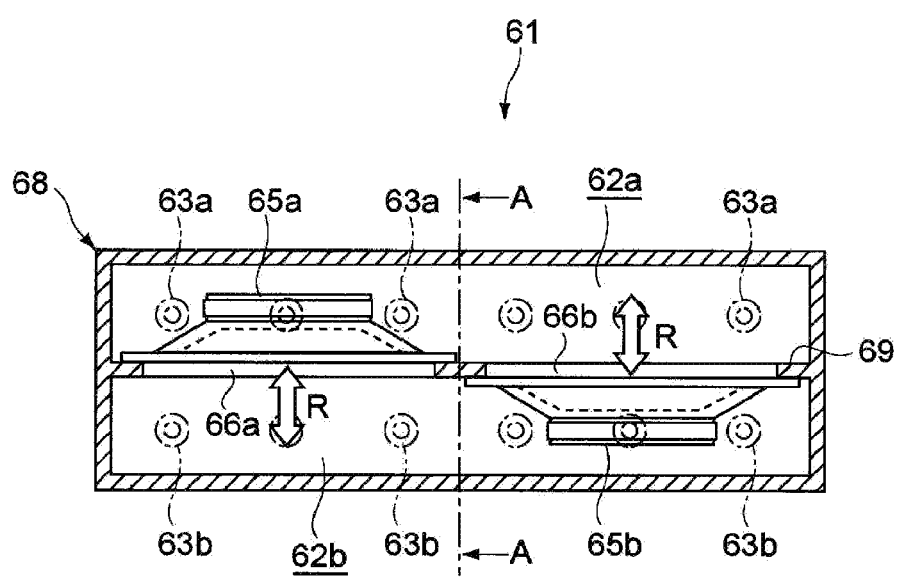
FIG. 4 is a sectional view of a gas ejector according to another embodiment of the present invention.
Figure 5:
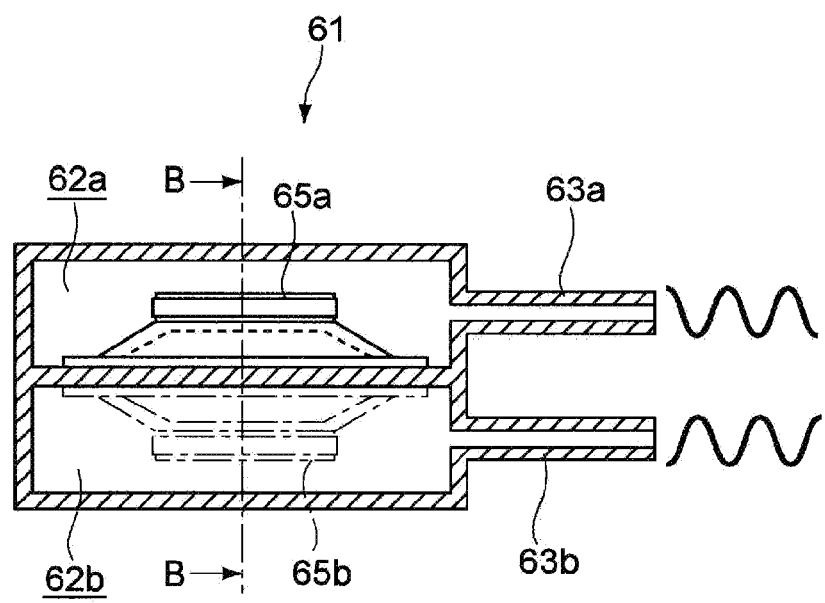
FIG. 5 is an A-A line sectional view taken along line A-A indicated in FIG. 4.

FIGS. 4 and 5 are sectional views of a gas ejector according to another embodiment of the present invention. FIG. 5 is an A-A line sectional view taken along line A-A indicated in FIG. 4, and FIG. 4 is a B-B line sectional view taken along line B-B indicated in FIG. 5. A gas ejector 61 has a structure in which a housing 68 has chambers 62a and 62b provided therein. The chambers 62a and 62b are formed by the housing 68 and a wall 69 provided in the housing 68. The chambers 62a and 62b respectively have vibrators 65a and 65b arranged therein. Each of the vibrators 65a and 65b has the same structure as that of the vibrator 25 or the like as shown in FIGS. 1 and 2, for example. The housing 68 has nozzles 63a and 63b in communication with the respective insides of the chambers 62a and 62b provided therein, thereby allowing air to be discharged respectively from the chambers 62a and 62b. The vibrators 65a and 65b are provided so as to respectively block openings 66a and 66b provided in the wall 69. Vibrating air in the chamber 62a with the vibrator 65b discharges air from the nozzle 63a. Also, vibrating air in the chamber 62b with the vibrator 65a discharges air from the nozzle 63b. The vibrators 65a and 65b are connected to a control section (not shown) the same as the control section 20 shown in FIG. 2 and controlled so as to vibrate, for example, in a mutually reverse phase, with the same amplitude as each other.

Since the vibrators 65a and 65b are arranged so as to have the same vibrating direction R as each other and face in mutually opposite directions as described above, even when the vibrators have an asymmetric shape as that of a loudspeaker, the overall symmetry can be kept. Accordingly, the waveforms of sound waves respectively generated from the nozzles 63a and 63b can be made the same as each other to the utmost, thereby improving a quietness property.

While the gas ejector 61 according to the present embodiment includes two vibrators, if an even number of vibrators are provided, the sound waves likewise weaken each other.

Figure 6:
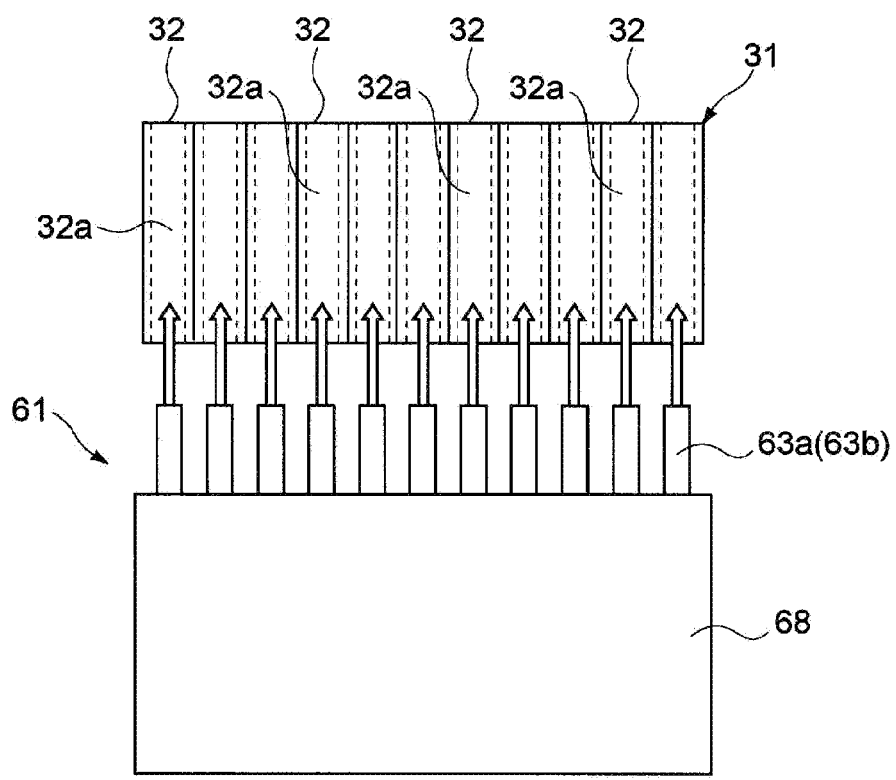
FIG. 6 is a plan view of the gas ejector having greater numbers of nozzles and than those shown in FIG. 4 and a heat sink.

FIG. 6 is a plan view of the gas ejector 61 having greater numbers of the nozzles 63a and 63b than those shown in FIG. 4 and a heat sink 31. The gas ejector 61 is arranged relative to the heat sink 31 such that each of the nozzles 63a (63b) faces an air passing section 32a of, e.g., each of fin members 32 of the heat sink 31. With this, the heat sink 31 is effectively utilized, thereby improving a heat-dissipation efficiency.

Figure 7:
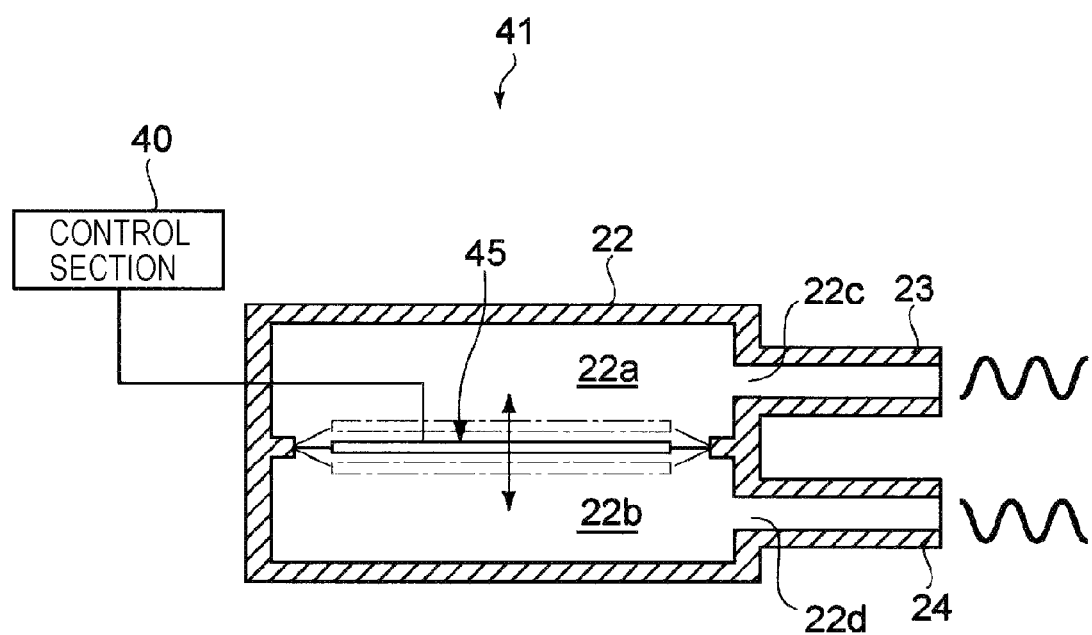
FIG. 7 is a sectional view of a gas ejector according to another embodiment of the present invention.

FIG. 7 is a sectional view of a gas ejector according to another embodiment of the present invention. A gas ejector 41 according to the present embodiment includes a plate-like vibrator 45 instead of the vibrator 25 of the gas ejector 1 shown in FIG. 2. The vibrator 45 is configured by bonding a flat coil (not shown) onto, e.g., a resin-made film. When a control section 40 applies an alternative voltage on the coil, the vibrator vibrates up and down in the figure by making use of a magnetic field of a magnet (not shown) arranged, for example, in the housing 22. By providing the plate-like vibrator 45 as described above, a symmetric structure is achieved by the chamber 22a side and chamber 22b side, thereby reducing a noise and the like as little as possible.

Although the gas ejectors 1, 61, and 41 according to the corresponding embodiments can reduce a noise while effectively dissipating heat of a heater as described above, completely deadening a generated sound is difficult. The followings are listed as the reasons for this.

1) Noises generated on the front and rear sides of the vibrator have fundamental components having mutually different amplitudes.

2) Noises generated on the front and rear sides of the vibrator have fundamental components mutually out of phase shifted from 180 degrees.

3) Noises generated on the front and rear sides of the vibrator have harmonic components (distorted components) having mutually different amplitudes.

4) Noises generated on the front and rear sides of the vibrator have harmonic components mutually out of phase shifted from 180 degrees.

Figure 8B:
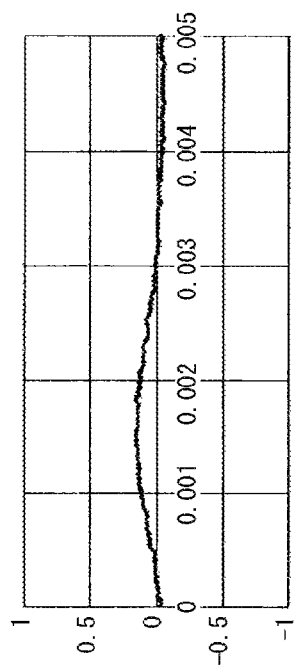
FIGS. 8A and 8B illustrate measured results of sound waves emitted from respective nozzles of the gas ejector shown in FIG. 1.
Figure 8A:
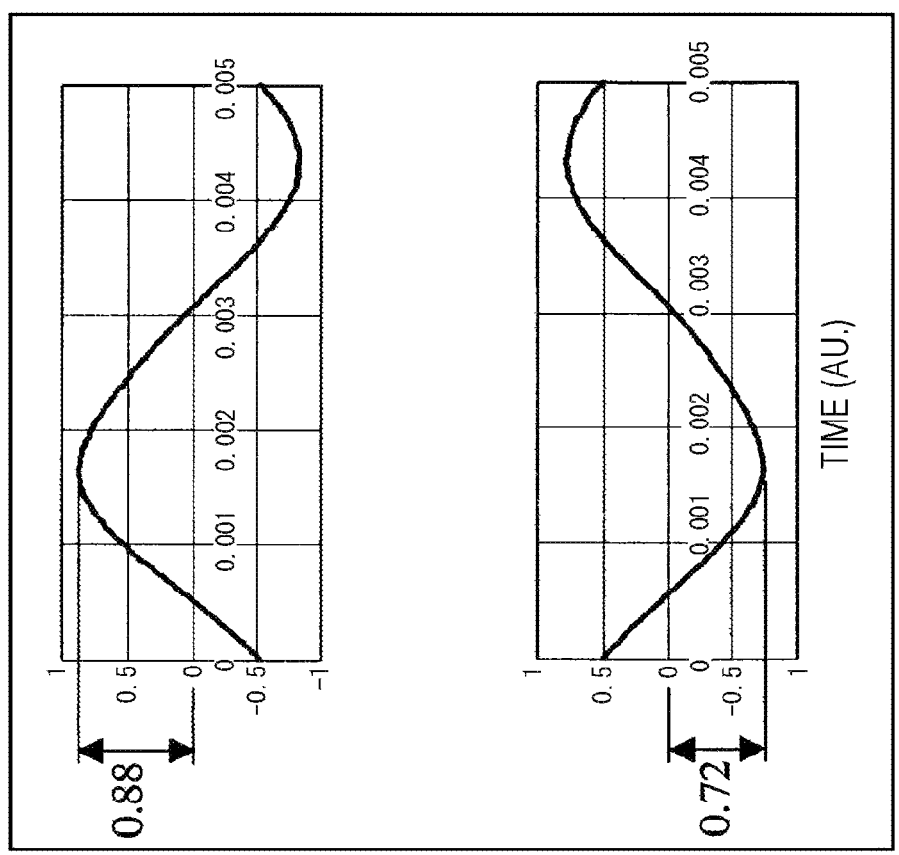

For example, in the gas ejector 1 shown in FIGS. 1 and 2, the front surface of the vibrator 25 faces the chamber 22b, and a frame on the rear side (close to an actuator) of the vibrator 25 faces the chamber 22a. In general, since a sound pressure on the rear of the vibrator 25 having a loudspeaker shape is not taken into account so much, and the frame sometimes has a noise insulating effect, the sound pressure on rear side is lower than that on the front side. In other words, with this structure, the amplitudes of the fundamental waves on the front and rear sides are generally different from each other, resulting in remaining of a noise. FIG. 8A illustrates measured results of sound waves emitted from each nozzle 23 and each nozzle 24 on the basis of this structure, wherein the upper and lower graphs illustrate the measured results of the sound waves respectively emitted from each lower nozzle 24 and each upper nozzle 23 shown FIG. 1. FIG. 8A indicates that the sound wave emitted from the nozzle 24 has a greater amplitude than that emitted from the nozzle 23. FIG. 8B illustrates a synthesized sound of them. As seen from FIG. 8B, a noise at the frequency of the fundamental wave remains.

Figure 9B:
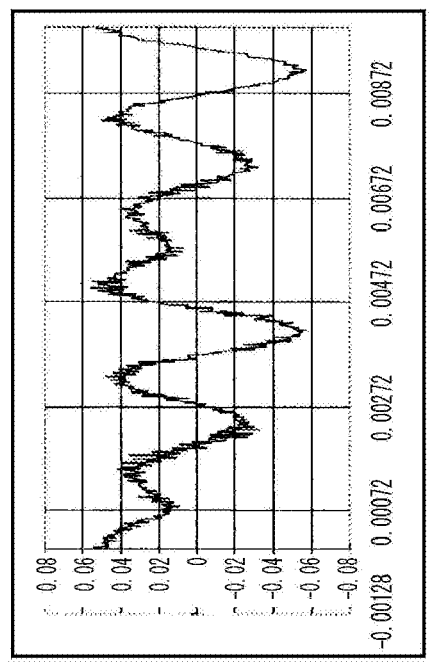
FIGS. 9A and 9B illustrate measured results of sound waves emitted from respective nozzles of the gas ejector shown in FIG. 4.
Figure 9A:
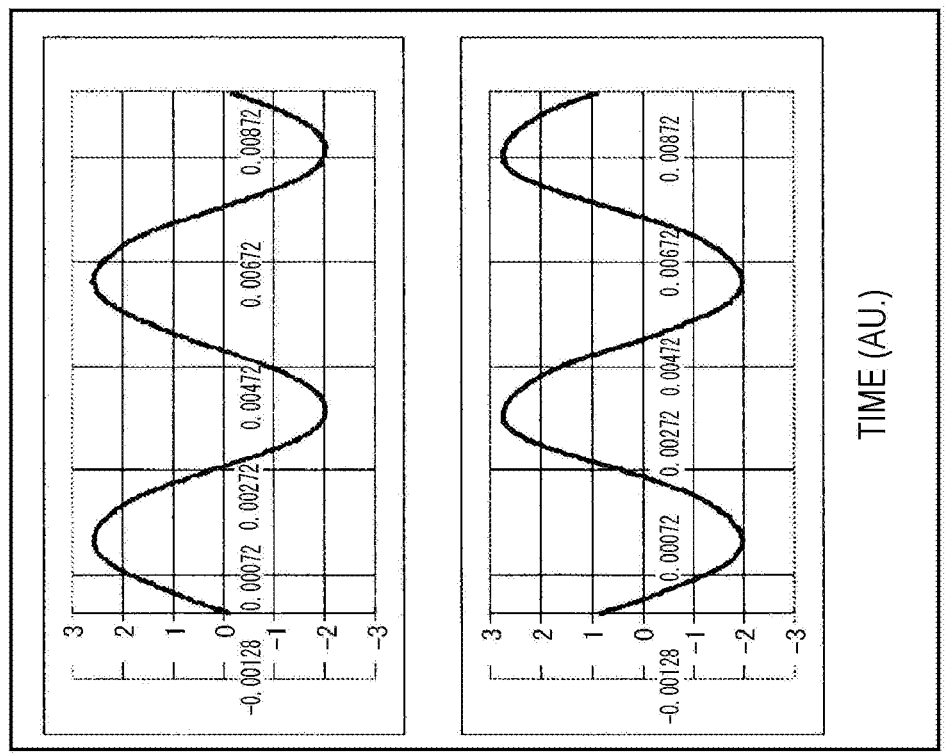

When the gas ejector 61 shown in FIGS. 4 and 5 is employed, since a single front surface and a single rear surface of the loudspeaker face each chamber, the amplitudes of the fundamental waves emitted through each nozzle 63a and each nozzle 63b disposed in the corresponding two chambers 62a and 62b are nearly equal to each other. In this case, while the fundamental waves are deadened to a certain extent, deadening the harmonic components is insufficient. FIG. 9A illustrates measured results of sound waves emitted through each nozzle 63a and each nozzle 63b, and FIG. 9B illustrates a synthesized sound of them. As seen from FIG. 9B, while the magnification of the amplitude in the figure is smaller than that shown in FIG. 8B, the harmonic components, i.e., the second and the higher harmonic waves of the fundamental wave shown in FIG. 9A remain. This is due to the fact that use of a plurality of vibrators causes their individual differences to prevent the amplitudes and phases of harmonic waves emitted through the nozzles from respectively being made the same as each other.

A presumable countermeasure for solving these problems is such that a vibrator has a structure as symmetric as possible, a single vibrator is used if possible, and chambers are arranged on both sides of the vibrator. In addition, a further effective countermeasure is decreasing the fundamental frequency as low as possible.

Figure 10:
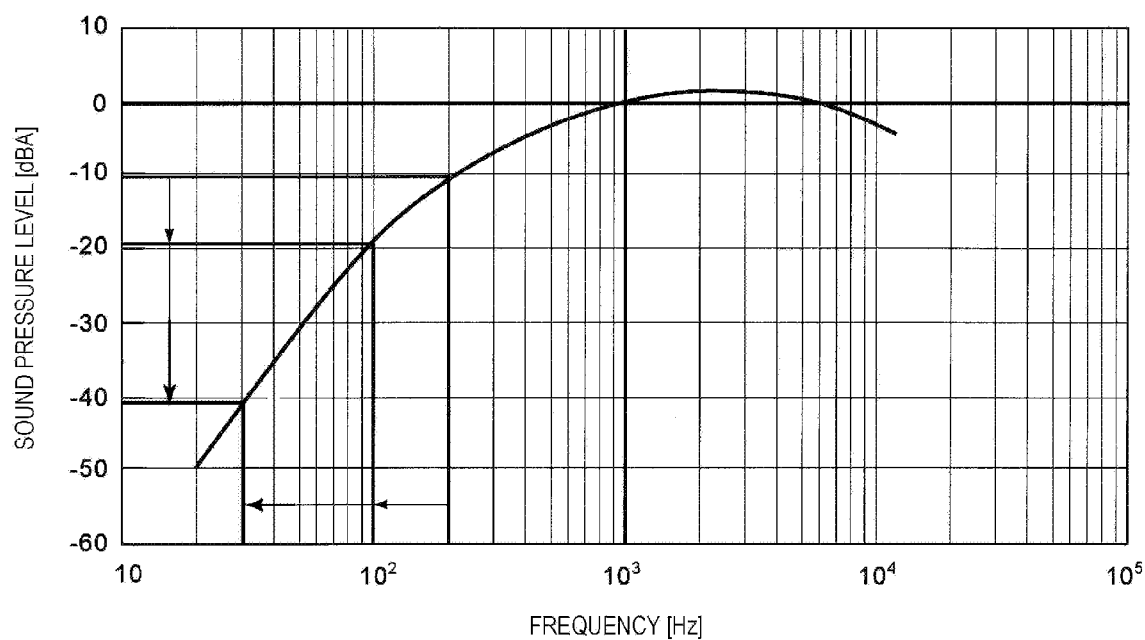
FIG. 10 is a graph illustrating a human audible characteristic.

FIG. 10 is a graph illustrating a human audible characteristic. The graph is an equal loudness curve (with an A-weighted characteristic) stipulated in JIS standard, illustrating that, when exposed to the same sound level in a frequency range from 20 (Hz) to 20 (kHz), the sound can be heard to what magnitude of the sound level. That is, the graph illustrates that, with reference to a sound wave at 1 (kHz), a sound at each frequency can be heard to what magnitude of the sound level. As seen from the figure, even with the same sound pressure, a sound at 50 (Hz) is heard weaker by 30 (dB) than that at 1 (kHz). A sound pressure Lp (dB) is defined by the following expression (1):

$$Lp = 20 \log(p/p0) \tag{1}$$

wherein p and p0 represent a sound pressure (Pa) and a reference sound pressure (20 µPa), respectively.

Without decreasing a frequency as low as 20 Hz, as long as the frequency is close to 20 Hz, a sound at the frequency has a sufficiently low audibility and its noise level with an A-weighted characteristic taking account the audible characteristic is low. Also, decreasing the frequency of the fundamental wave accompanies decreasing the frequencies of the harmonic waves, whereby harmonic noises are shifted to a portion of the audible characteristic as low as possible. Since decreasing the frequency entails reducing the ejection quantity of gas from the nozzles, simply decreasing the frequency is not enough.

The experiment conducted by the present inventors et al. confirms the fact that a satisfactory sound-deadening effect is obtained by the fundamental wave at about 30 Hz. As shown in FIG. 10, under the same sound pressure, if the frequency drops from 200 (Hz) to 100 (Hz), the noise level decreases by about 10 (dBA), and, if the frequency drops from 100 to 30 Hz, the noise level additionally decreases by about 20 (dBA) from that at 100 Hz.

From the viewpoint of a sound at a single frequency, while driving the vibrator at a low frequency decreases the noise level, the low driving frequency decreases the number of reciprocation of the vibrator accordingly as described above, resulting in a reduced quantity of gas ejected through the nozzle. In view of this, employment of a vibrator offering a satisfactory amplitude is needed. In other words, taking account the characteristic of a vibrator such as a loudspeaker, a sound pressure at, e.g., not higher than 200 Hz such as 30 (Hz) or 100 (Hz) must be obtained.

Figure 11:
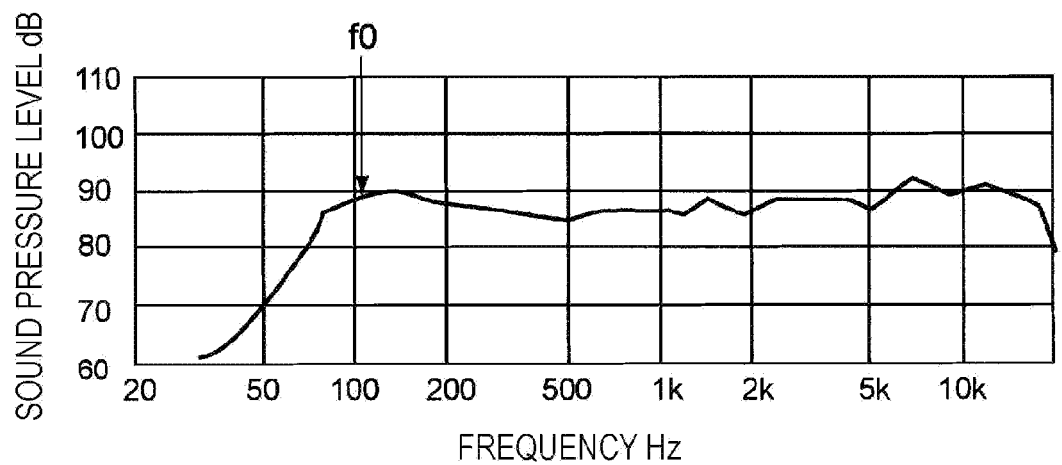
FIG. 11 illustrates an example acoustic characteristic of a loudspeaker having the lowest resonant frequency f0 of 110 Hz.
Figure 12:
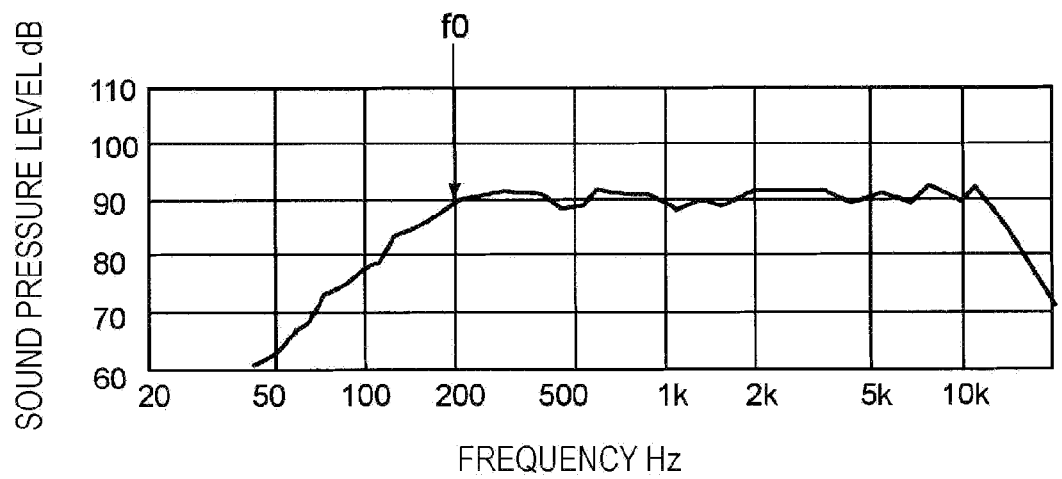
FIG. 12 illustrates an example acoustic characteristic of a loudspeaker having the lowest resonant frequency f0 of 200 Hz.

FIGS. 11 and 12 illustrate example acoustic characteristics of loudspeakers having the lowest resonant frequencies f0 of 110 (Hz) and 200 (Hz), respectively. The sound pressure levels at frequencies higher than the respective lowest resonant frequencies f0 are both about 90 (dB). However, in the frequency ranges lower than the respective lowest resonant frequencies f0, at the same frequency, the speaker having the lower lowest resonant frequencies f0 has a higher sound pressure than that having the higher lowest resonant frequencies f0. Focusing on the sound pressures, e.g., at 50 (Hz), while the sound pressure of the loudspeaker having the resonant frequency f0 of 110 (Hz) is 70 (dB), the sound pressure of the loudspeaker having the resonant frequency f0 of 200 (Hz) is about 62 (dB). This is because each sound pressure has an amplification characteristic of 40 (dB/dc) in a frequency range lower than f0.

That is, presuming that the loudspeaker has a characteristic equivalent to the driving characteristic of the vibrator 25 or the like according to each of the foregoing embodiments, it can be said that the loudspeaker having the lower lowest resonant frequencies f0 has a higher sound pressure at a low frequency. A higher sound pressure results in a greater ejection quantity or flow rate of gas from a nozzle. Accordingly, it can be said that the lower the lowest resonant frequency f0 of the vibrator including a driving system, the ejection quantity or the flow rate of gas in a low frequency range is increased. When the vibrator is driven, e.g., at 30 (Hz), while the lowest resonant frequencies f0 is preferably low and close to 30 (Hz), the experiment conducted by the present inventors, et al. reveals the fact, with a loudspeaker having the lowest resonant frequency f0 about 100 (Hz), even driven at 30 (Hz), a sound pressure (e.g., an amplitude) of a necessary vibrator can be obtained.

Accordingly, it is sufficient to employ a vibrator having the lowest resonant frequency f0 not higher than 200 Hz, preferably not higher than 150 (Hz), and more preferably not higher than 100 (Hz) and drive it in a frequency range lower than the corresponding lowest resonant frequency f0.

Factors for increasing the ejection quantities of gas of the gas ejectors 1, 41, and 61 according to the respective embodiments are listed below:
1) The area of the vibrator is large,
2) The amplitude of the vibrator is large, and
3) The driving frequency of the vibrator is high.

Figure 14:
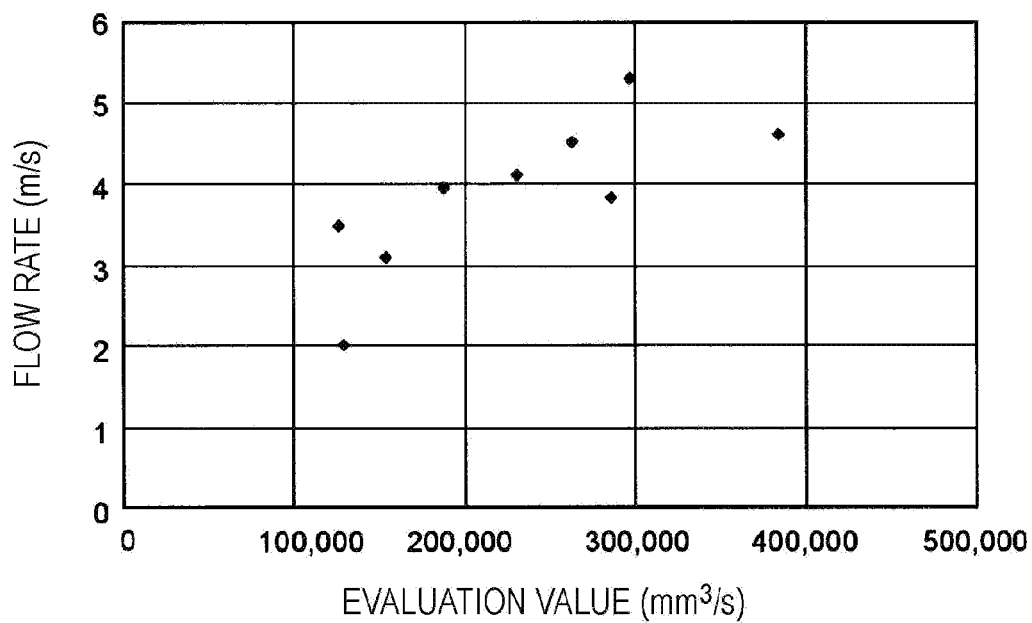
FIG. 14 is a graph illustrating the relationship between the evaluation value and the flow rate of ejected gas.

In view of the above factors, the present inventors et el. have conceived an evaluation value D given by D=A×B×C, wherein a driving frequency of the vibrator, an amplitude of the vibrator, and an area of the vibrator (in the case of a plurality of vibrators, the total area thereof) are respectively represented by A (Hz), ±B (mm), and C (mm$^2$). FIG. 13 is a table illustrating the relationship between an evaluation value and so forth and a flow rate of gas. Also, FIG. 14 is a graph illustrating the relationship between the evaluation value and the flow rate of ejected gas. In this case, it can be presumed that the flow rate is in proportion to the ejection quantity of gas (a moving quantity of gas per unit time).

The gas ejector as shown in FIG. 1 or 4, including 32 pieces of nozzles, each having an internal diameter of 3 mm, is used for conducting the experiment. A commercially available loudspeaker is employed as a vibrator, since the loudspeaker is most available vibrator designed to reciprocate in the range from about 20 (Hz) to 200 (Hz). FIGS. 13 and 14 indicate the tendency that the greater the evaluation value D, the flow rate increases.

When a heat dissipation capacity is evaluated by blowing air emitted from the gas ejector, onto the heat sink as described above, roughly speaking, the higher the flow rate, the higher the heat dissipation capacity. As seen from FIG. 14, with respect to the evaluation value D, when it exceeds 100,000 (mm$^3$/s), the corresponding thermal resistance is about 1 (K/W), and, also, when it exceeds 200,000 (mm$^3$/s), the corresponding thermal resistance and flow rate drops below 0.7 (K/W) and exceeds 4 (m/s), respectively, thereby proving these values to be satisfactory for a heat dissipation device. For your information, a heat dissipation device having a thermal resistance smaller than 0.3 (K/W) is used for heat dissipation of a 70 (W)-class CPU. While it should be considered that, since the specification of the heat dissipation capacity is determined depending on a use situation of an apparatus, it cannot be evaluated only from the flow rate, the flow rate offers rough determination information.

According to e JIS standard, the unit of thermal resistance is "(m$^2$K)/W", since the thermal resistance is defined as "a value obtained by dividing a thermal difference between two target surfaces by a thermal flux 1 (W/m$^2$)". The thermal flux is defined as "a quantity of heat transferred per unit area per unit time" (the unit of a quantity of heat is "J"). In the present invention, while the unit of a thermal resistance is defined by "K/W" as described above, and the unit of an "area" for the foregoing two surfaces is not considered, the unit "K/W" of a thermal resistance is also generally used. In the present embodiment, for example, when a temperature difference between a heater and air surrounding the heater is represented by Δt, a thermal resistance R is expressed by R=Δt/a wattage value of the heater.

From the present experiment, a synthetic jet flow, whose flow rate increases in accordance with an increase in a diameter and an amplitude, can be formed. Especially, the experiment reveals the fact that a cone (e.g., the diaphragm 27 shown in FIG. 2) of a loudspeaker, having an amplitude not smaller than 1 (mm) allows a higher flow rate and thus a higher heat dissipation capacity. If the amplitude is smaller than 1 (mm), in order to achieve a desired gas ejection quantity, the foregoing area C must be made sizably large, whereby this configuration is inappropriate for a practical use. The larger the amplitude exceeds than 1 mm, the better, and the amplitude is preferably 1 (mm) to 3 (mm) at the driving frequency A not higher than 100 (Hz), and ideally not smaller than 3 (mm) at 30 (Hz).

Also, taking account the upper limit of the size of the vibrator, the amplitude is preferably not greater 5 (mm). The preferable size of the vibrator is such that the area C is not greater than 70,000 (mm$^2$), in other words, its bore diameter (diameter) is not greater than 300 (mm). Because, if the area exceeds 70,000 (mm$^2$), even when attempted for being built in a desktop or laptop PC, the gas ejector is larger in size and possibly fails in being built in, whereby this arrangement is inappropriate for practical use.

When the area C is not greater than 70,000 (mm$^2$), the amplitude is set at 5 (mm) or less on the basis of the following reasons. In the case where the area C is about 70,000 (mm$^2$), and if the vibrator is vibrated at a frequency in the vicinity of, e.g., 35 (Hz), the amplitude exceeding 5 (mm) causes the vibrator to have a greater inertia, resulting in a greater mechanical load, and if the vibrator is vibrated at a frequency in the vicinity of 100 (Hz), the amplitude exceeding 5 (mm) causes the vibrator to have a greater inertia, resulting in a greater mechanical load.

Through the present experiment, with a speaker having a bore diameter not smaller than 60 (mm) (the area C=2827 (mm$^2$)), data of a thermal resistance not greater than 0.5 (K/W) is obtained. Presumed that, if the area C is about half the above value, the thermal resistance is about double, it is sufficient that the area C is 1,500 (mm$^2$) or greater. If the area is smaller than 1,500 (mm$^2$), in order to obtain a desired gas ejection quantity, the frequency must be equal to 200 (Hz) or higher, resulting in an increased noise, or the amplitude must be, for example, equal to 5 (mm) or greater, whereby this arrangement is inappropriate for practical use. In this case, the area C is preferably not smaller than 2,000 (mm$^2$).

BY applying the vibrator having the foregoing area C to any one of the gas ejectors 1, 41, and 61 according to the corresponding embodiments as described above, and controlling it at the driving frequency A and with the amplitude B, an effective heat dissipation process can be achieved and a noise can be reduced. Especially, a heat dissipation device adapted for a noise level not higher than 30 (dBA) and a thermal resistance not higher than 0.7 (K/W) can be achieved.

Figure 15:
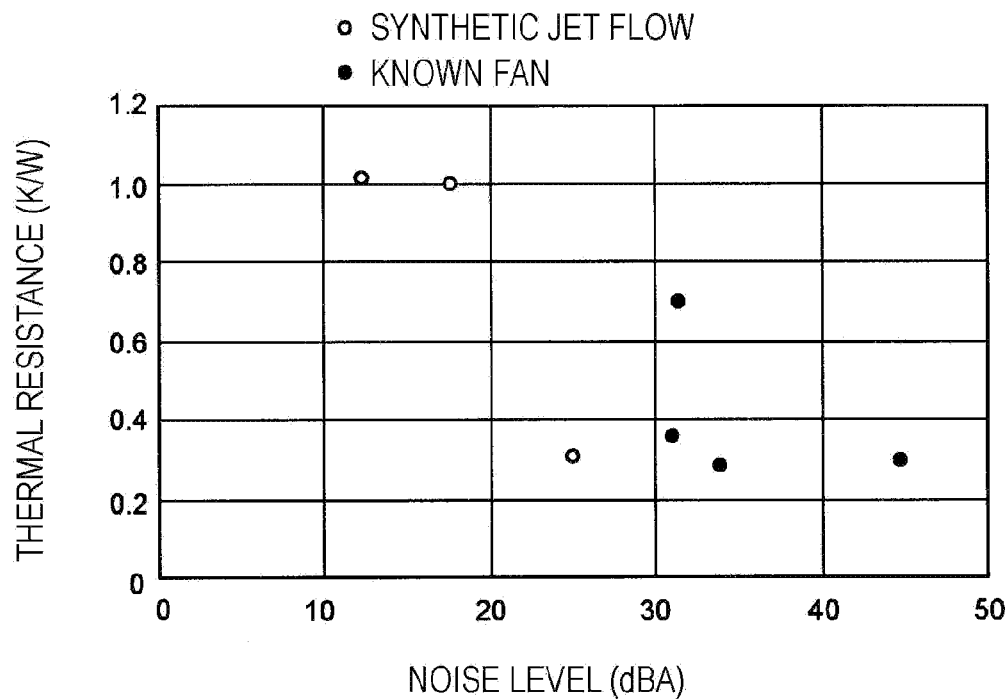
FIG. 15 illustrates characteristics of noise level vs. heat resistance.

FIG. 15 illustrates two characteristics with respect to noise level vs. heat resistance, comparing the one achieved by a known fan including a rotating impeller with the other achieved by the gas ejector according to any one of the embodiments. The thermal resistance here is defined as that between the heat sink serving as a heater and air surrounding the heat sink. As seen from this figure, the gas ejector according to any one of embodiments offers better values of both a thermal resistance and a noise level compared to those offered by the known fan.

In order to miniaturize the gas ejector according to any one of the present embodiments, employment of a vibrator having a small bore diameter is needed. However, as is seen from the foregoing idea of the evaluation value, a small diameter is not advantageous. As a countermeasure for this, employment of a vibrator achieving a large amplitude is recommended. According to a technique of the present invention, with respect to an envelope volume of about 250 cc, including the heat sink, a thermal resistance not greater than 0.7 (K/W) and a noise level not higher than 30 (dBA) or 25 (dBA) at a position 1 m away from a sound source are achieved.

Figure 16:
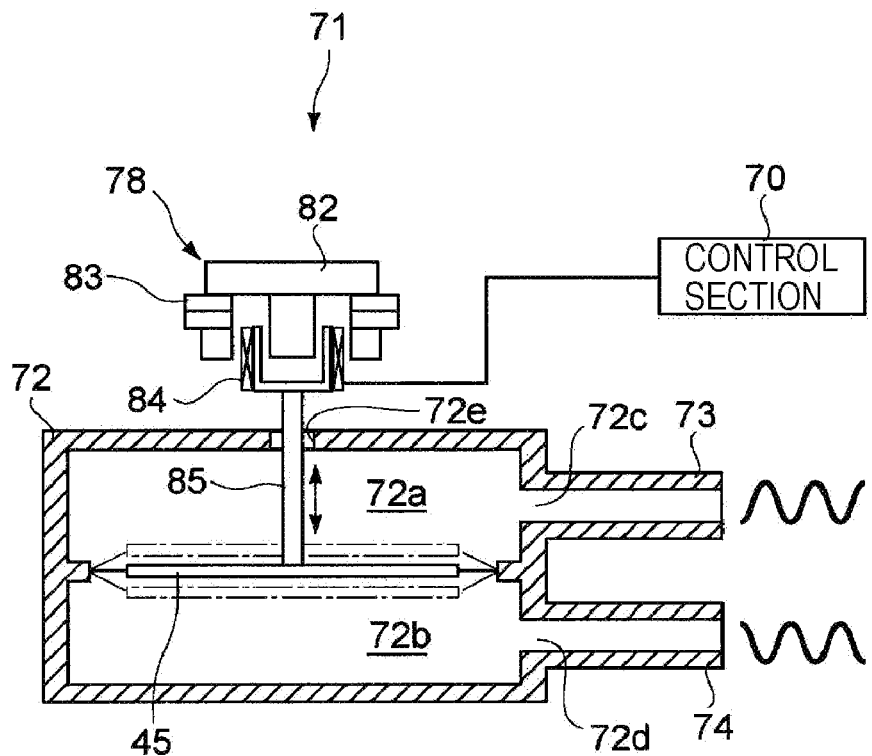
FIG. 16 is a sectional view of a gas ejector according to another embodiment of the present invention.

FIG. 16 is sectional view of a gas ejector according to another embodiment. As a vibrator of a gas ejector 71 according to the present embodiment, the plate-like vibrator 45 shown in FIG. 7 is employed. The vibrator 45 has a rod 85 fixed thereto, of an actuator 78 adapted for actuating the vibrator 45. The rod 85 is inserted through a bore section 72e perforated in a housing 72. The actuator 78 includes a yoke 82, a magnet 83, a coil 84, and so forth. When a control section 70 applies, e.g., an alternating voltage on the coil, the rod 85 moves up and down in the figure so as to vibrate the vibrator 45.

In the present embodiment, since the actuator 78 is arranged outside the housing 72, the respective volumes of chambers 72a and 72b can be made equal to each other to the utmost. Also, if the actuator 78 is arranged in the housing 72, heat of the actuator 78 possibly remains in the chamber 72a or 72b. When the vibrator is vibrated in such a state, a gas flow containing the heat is ejected, resulting in a reduced capacity of heat dissipation. Fortunately, in the present embodiment, such a problem can be prevented.

Figure 17:
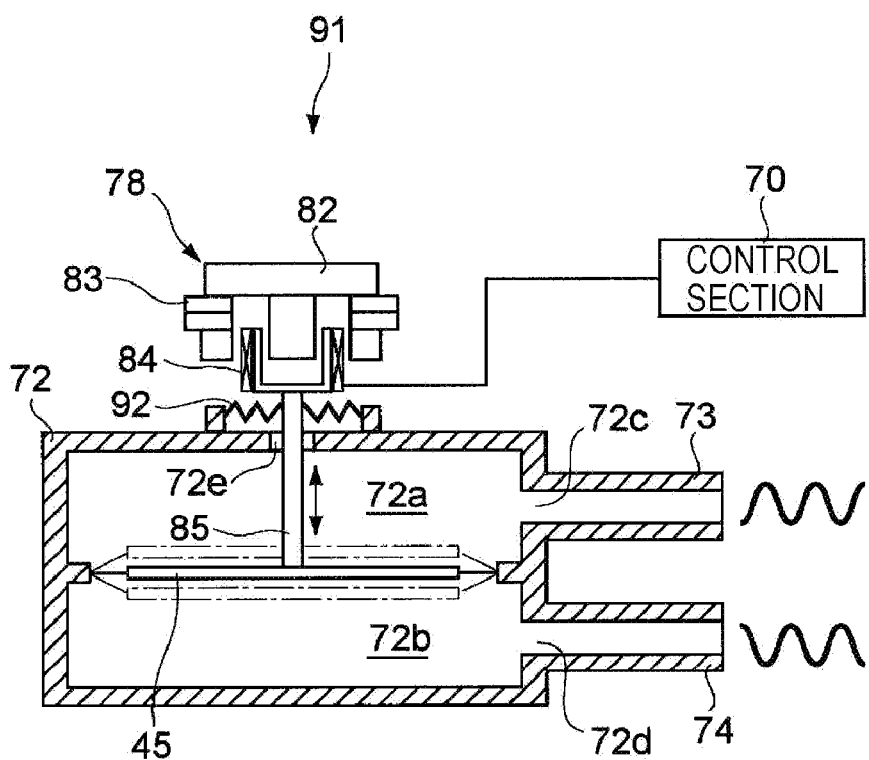
FIG. 17 is a sectional view of a modification of the gas ejector shown in FIG. 16.

FIG. 17 is a sectional view of a modification of the gas ejector shown in FIG. 16. A gas ejector 91 as a modification of that shown in FIG. 16 includes a supporting member 92 configured to support the rod 85. The supporting member 92 is composed of a bellow member, for example. With the supporting member 92, the rod 75 is prevented from lateral deflection relative to the vibration direction of the vibrator 45, thereby achieving stable vibration of the vibrator 45. Also, when the supporting member 92 is disposed, for example, so as to cover the bore section 72e and seal the housing 72, air in the housing 72 is prevented from leaking from the bore section 72e when the vibrator 45 is vibrated.

The present invention is not limited to the above-described embodiments and a variety of modifications are possible.

While the gas ejector according to each embodiment includes a single housing by way of example, it may have a structure in which a plurality of independent housings are prepared, and a vibrator is provided in each housing. In this case, by controlling a phase and a frequency of the vibrator, a noise can be reduced.

In the gas ejector shown in FIG. 7, while the vibrator 45 is vibrated with the coil by way of example, the vibrator has no problem about being composed of, e.g., a piezoelectric device. In the case of employing a piezoelectric device, when microminiaturized, the gas ejector is especially effective.

The invention claimed is:

1. A gas ejector including at least one vibrator, comprising:
a plurality of ejecting sections arranged to eject a pulsating gas flow such that sound waves generated by the vibration of an upper portion of a vibrator and sound waves generated by a lower portion of the vibrator have the same wave form but reversed phases such that the sound waves weaken each other upon ejection from the ejector; and
a first control unit which controls the frequency of the vibration of the vibrator.

2. The gas ejector according to claim 1, further comprising a second control unit which controls the amplitude of the vibrator.

3. The gas ejector according to claim 1, wherein the vibrator has a lowest resonant frequency lower than 200 (Hz).

4. The gas ejector according to claim 3, wherein the vibrator has the lowest resonant frequency of lower than 150 (Hz).

5. The gas ejector according to claim 1, wherein the first control unit controls the frequency to a value higher than 100 (Hz).

6. The gas ejector according to claim 5, wherein the first control unit controls the frequency to a value higher than 35 (Hz).

7. The gas ejector according to claim 2, wherein the vibrator has a surface extending substantially orthogonal to the direction of vibration thereof, and, when the area of the surface is not greater than 70,000 (mm$^2$), the first control unit controls the frequency to a value higher than 100 (Hz), and the second control unit controls the amplitude to a value in the range from 1 (mm) to 3 (mm).

8. The gas ejector according to claim 7, wherein the second control unit controls the amplitude so as to be in the range from 1.5 (mm) to 3 (mm).

9. A gas ejector including at least one vibrator, comprising:
a plurality of ejecting sections arranged to eject a pulsating gas flow such that sound waves generated by the vibration of an upper portion of a vibrator and sound waves generated by a lower portion of the vibrator have the same wave form but reversed phases such that the sound waves weaken each other upon ejection from the ejector;
a first control unit which controls the frequency of the vibration of the vibrator; and
a second control unit which controls the amplitude of the vibrator,
wherein the vibrator has a surface extending substantially orthogonal to the direction of vibration thereof, and, when the area of the surface is not greater than 70,000 (mm$^2$), the first control unit controls the frequency so as not to be higher than 35 (Hz), and the second control unit controls the amplitude so as to be in the range from 1 (mm) to 5 (mm).

10. The gas ejector according to claim 9, wherein the second control unit controls the amplitude so as to be in the range from 2 (mm) to 5 (mm).

11. The gas ejector according to claim 1, wherein the vibrator has a surface extending substantially orthogonal to the direction of vibration thereof, and the area of the surface is in the range from 1,500 (mm$^2$) to 70,000 (mm$^2$).

12. The gas ejector according to claim 11, wherein the area of the surface of the vibrator is greater than 2,000 (mm$^2$).

13. The gas ejector according to claim 2, wherein the vibrator has a surface extending substantially orthogonal to the direction of vibration thereof, and
wherein, when the frequency driven by the first control unit, the amplitude driven by the second control unit, and the area of the surface are respectively defined by A (Hz), B (mm), and C (mm$^2$), the value of A×B×C is given in the range from 100,000 (mm$^3$/s) to 10,000,000 (mm$^3$/s).

14. The gas ejector according to claim 13, wherein the value of A×B×C is smaller than 200,000 (mm$^3$/s).

15. A gas ejector including at least one vibrator, comprising:
a plurality of ejecting sections arranged to eject a pulsating gas flow such that sound waves generated by the vibration of an upper portion of a vibrator and sound waves generated by lower portion of the vibrator have the same wave form but reversed phases such that the sound waves weaken each other upon ejection from the ejector; and
a control unit which controls the frequency of the vibration of the vibrator,
wherein,
a thermal resistance of the region between a heater, to which the gas ejected from the respective ejecting sections is supplied, and gas surrounding the heater is lower than 0.7 (K/W), and a noise level at a position about 1 (m) away from a sound source of the sound waves is lower than 30 (dBA).

16. The gas ejector according to claim 15, wherein the noise level is not higher than 25 (dBA).

17. The gas ejector according to claim 16, wherein an envelope volume containing the respective ejecting sections is lower than 250 (cm$^3$).

18. The gas ejector according to claim 1, wherein the vibrator has an approximately symmetrical shape with respect to a plane extending orthogonal to the direction of vibration thereof.

19. A gas ejector including at least one vibrator, comprising:
a plurality of ejecting sections arranged to eject a pulsating gas flow such that sound waves generated by the vibration of an upper portion of a vibrator and sound waves generated by a lower portion of the vibrator have the same wave form but reversed phases such that the sound waves weaken each other upon ejection from the ejector; and
a control unit which controls the frequency of the vibration of the vibrator,
wherein,
a thermal resistance of the region between a heater, to which the gas is ejected from the respective ejecting sections, and gas surrounding the heater is lower than 0.5 (K/W), a noise level at a position about 1 (m) away from the sound source of the sound waves is lower than 30 (dBA), and an envelope volume containing the respective ejecting sections and the heater lower than 500 (cm$^3$).

20. The gas ejector according to claim 1, wherein the vibrator includes a first vibrator having a surface extending orthogonal to the direction of vibration thereof and an asymmetrical shape with respect to the surface; and
a second vibrator having substantially the same shape as that of the first vibrator and arranged so as to vibrate along substantially the same direction as but in an opposite direction to that of the first vibrator.

21. The gas ejector according to claim 1, wherein the respective ejecting sections include a housing including a plurality of chambers partitioned by the vibrator such that the chambers adapted for ejecting the gas have substantially the same volume as each other.

22. The gas ejector according to claim 1, wherein:
the respective ejecting sections include a housing including a plurality of chambers partitioned by the vibrator and adapted for ejecting the gas, and
an actuator arranged outside the housing and adapted for driving the vibrator.

23. The gas ejector according to claim 22, wherein the housing has a bore section extending from the outside thereof to at least one of the chambers, the gas ejector further comprising:
a rod extending through the bore section and fixed to the vibrator so as to move integrally with the actuator, and
a supporting member provided in the bore section so as to support the rod.

24. An electronic device including at least one heater and at least one vibrator, comprising:
a plurality of ejecting sections arranged to eject a pulsating gas flow such that sound waves generated by the vibration of an upper portion of a vibrator and sound waves generated by a lower portion of the vibrator have the same wave form but reversed phases such that the sound waves weaken each other upon ejection from the ejector; and
control means for controlling the frequency of the vibration of the vibrator.

25. A gas ejecting method, comprising the steps of:
ejecting a pulsating gas flow from an ejector such that sound waves generated by the vibration of an upper portion of a vibrator and sound waves generated by a lower portion of the vibrator have the same wave form but reversed phases such that the sound waves weaken each other upon ejection from the ejector; and
using a control unit to control the frequency of the vibration of the vibrator.

* * * * *